SEMICONDUCTOR CURRENT CONTROL DEVICE AND METHOD

Filed Dec. 20, 1965

INVENTORS
BENJAMIN KAZAN,
JOHN S. WINSLOW

ATTORNEY:
WILLIAM A. KEMMEL JR.

United States Patent Office 3,523,188

Patented Aug. 4, 1970

3,523,188
SEMICONDUCTOR CURRENT CONTROL DEVICE AND METHOD

Benjamin Kazan, Pasadena, and John S. Winslow, Altadena, Calif., assignors, by mesne assignments, to Xerox Corporation, a corporation of New York Filed Dec. 20, 1965, Ser. No. 514,864
Int. Cl. H01l 15/00
U.S. Cl. 250—211 28 Claims

ABSTRACT OF THE DISCLOSURE

This application relates to a current control device having spaced electrodes on a supporting substrate and a field-effect semiconductor therebetween. In one embodiment, the field-effect semiconductor material is a storing field-effect semiconductor such that it is capable of retaining an electrostatic charge on the exposed surface thereof and conducting current through the central portion thereof without substantially affecting the charge thereon. The field-effect semiconductor may also have photoconductive properties such that it is capable of dissipating charge applied to the exposed surface in response to actinic electromagnetic radiation impinging thereon. In a further embodiment, the field-effect semiconductor layer has an overlying photoconductive insulating layer. In either embodiment, current flow between the spaced electrodes through the field-effect semiconductor is modulated by the polarity and magnitude of the electrostatic charge on the exposed surface of the current control device.

In general, the present invention relates to a current control device and method. More particularly, the present invention relates to a semiconductor current control device and method which involves producing and retaining an electrostatic charge on the surface of the semiconductor material and regulating the flow of current through such material by such stored charge. In addition, the device and method of the present invention dissipating such stored charge in response to radiant energy impinging thereon.

At present, photoconductive cells are in wide use which employ a semiconductor material such as cadmium sulfide to regulate the flow of current therethrough in response to radiant energy impinging on the body of cadmium sulfide. Such cells have been very useful in applications such as operating relays because of their high sensitivity and fast response to changes in light intensity. Thus, such photoconductive cells offer a substantially instantaneous measurement of light intensity. However, for just this reason, conventional photoconductive cells substantially lose their conductivity when the radiant energy ceases to impinge thereon. Furthermore, conventional photoconductive cells are incapable of integrating the radiant energy input thereto.

Another widely used current control device is the field effect transistor wherein the current flow through a semiconductor material is regulated by the electrical potential imposed upon a gate electrode separated from the semiconductor material by permanent barrier means such as an insulating layer. Such field effect transistor devices have wide application for current amplification purposes and provide an instantaneous control of the current by the potential applied to the gate electrode. However, the field effect transistors require the more complicated structures such as the permanent barrier means and gate electrode for their operation, and more important, are not influenced radiant energy impinging thereon. The field effect transistor and the photoconductive cell have been combined into single devices such as the device taught by the U.S. Pat. No. 2,985,805 issued May 23, 1961, entitled "Semiconductor Devices." However, in such devices the field effect transistor portion and the photoconductive cell portion continue to function in the same manner as they do when operated as separate devices.

Consequently, an object of the present invention is a current control device and method which controls the passage of current therethrough simply by the storage of electrostatic charge by a body of semiconductor material and yet permits the dissipation of such charge in response to radiant energy impinging thereon.

Another object of the present invention is a current control device and method wherein the radiant energy impinging on the device continues to control the current therethrough after such exposure has stopped.

Still another object of the present invention is a radiant energy integrating device which is adapted to measure the total radiant energy input through the device after exposure to the radiant energy.

Still another object of the present invention is a method of regulating current flow by the storage of selected electrostatic charge directly on the surface of a body of semiconductor material.

Still another object of the present invention is a method of measuring total radiant energy input to a surface by measuring the change of current flow on a semiconductor body caused by the discharge of electrostatic charge on the body surface by such radiant energy.

Other objects and advantages of the present invention will be readily apparent from the following description and drawings which illustrate a preferred exemplary embodiment of the present invention.

In general, the present invention involves a current control device consisting essentially of a body of semiconductor material having a charge accessible surface and adapted to store an electrostatic charge on said surface and to dissipate said charge in response to radiant energy impinging thereon. On at least a portion of the charge accessible surface is a selected electrostatic charge adapted to regulate current flow through said body. Also, electrically connected to said body, are means for passing current through said body without substantially electrically contacting said charge. In addition, the device may include a means for producing such selected electrostatic charge on said body surface. The present invention also involves the method of providing such body, producing selected electrostatic charge thereon and then passing current through said body without substantially electrically contacting said charge. Particularly, the present invention involves a radiant energy integrating device and method such as described wherein the impinging radiant energy dissipates the electrostatic charge and thereby the total radiant energy input is measured by the change in current flow.

In order to facilitate understanding of the present invention, reference will now be made to the appended drawings of a preferred specific embodiment of the present invention. Such drawings should not be construed as limiting the invention which is properly set forth in the appended claims. In the drawings:

Figure 2:
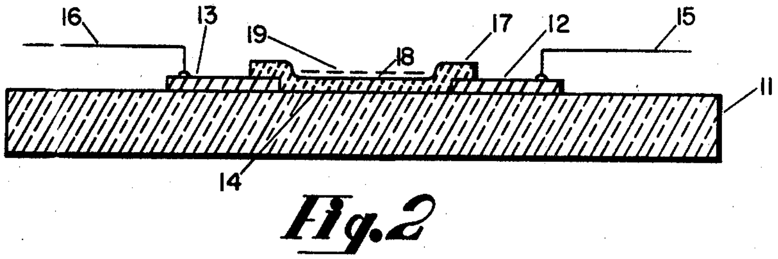
FIG. 2 is a cross-sectional view of FIG. 1 taken along line 2—2 of FIG. 1.
Figure 1:
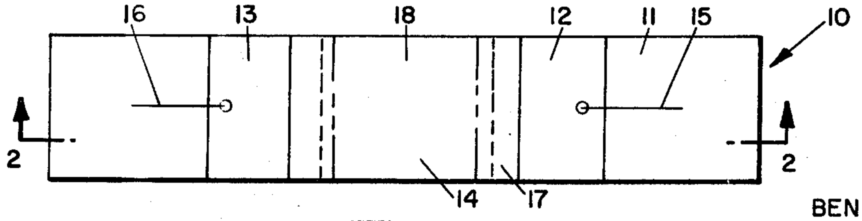
FIG. 1 is a plan view of a specific embodiment of the device of the present invention.

As illustrated in FIGS. 1 and 2, the device 10 includes a glass support plate 11 on which are deposited adjacent layers of metal 12 and 13 separated by a gap 14. Each of the metal layers 12 and 13 have leads 15 and 16, respectively, connected thereto. Deposited on the adjacent portions of the metal layers 12 and 13 and across the gap 14 is a body 17 of storing semiconductor material having a charge accessible surface 18. As used in this application, the term "storing semiconductor material" refers to semiconductor material such as zinc oxide adapted to retain an electrostatic charge on its surface, to conduct current through the central portion thereof without substantially dissipating such charge and to dissipate such charge in response to impinging radiation.

On the surface 18 of the body 17, as shown in FIG. 2, is a negative electrostatic charge 19 which is adapted to regulate the flow of current through the body 17. The leads 15 and 16 provide means for passing current through the body 17 without substantially electrically contacting charge 19. Thus the current flows through body 17 adjacent to surface 18 but is substantially electrically insulated therefrom due to characteristics of the storing semiconductor material. It should be understood that in all of the figures the thickness of the layers has been greatly exaggerated to show the details of construction.

The following specific examples will serve to illustrate the device shown in FIGS. 1 and 2 and to make clear the manner in which it may be constructed. Such examples should not be construed as limiting the invention which is properly set forth in the appended claims.

EXAMPLE 1

A glass plate about one inch long and 5 mm. wide and one mm. thick has adjoining layers of aluminum about 1500 angstroms thick separated by a gap of about 0.005 inch deposited thereon by vapor deposition. To each aluminum layer is attached an electrical lead by some convenient means. On top of the adjacent portion of the aluminum layers is coated a zinc oxide composition having a thickness of about 0.001 inch. The zinc oxide composition is deposited by any convenient means such as spraying on as long as the thickness of the coating after drying is the desired thickness. Such coating composition may have the same formulation as that used for electrophotographic paper coatings. A specific example of such coating composition is as follows:

| Material: | Pounds per 100 gallons |
|---|---|
| Zinc oxide | 533.000 |
| Pliolite S–5D [1] | 107.000 |
| Chlorinated Paraffin 40 | 27.000 |
| Toluene | 533.000 |
| Bromophenol Blue | 0.021 |
| Methyl Green | 0.016 |
| Acridine Orange | 0.016 |
| | 1200.053 |

[1] Pliolite S–5D is a styrene-butadiene copolymer produced by the Chemical Division of the Goodyear Tire and Rubber Co., Akron, Ohio. A detailed discussion of the aforementioned zinc oxide composition is set forth in the publication titled "Tech-Book Facts," Formulations PLS–37, Chemical Division, Goodyear Tire and Rubber Co., Akron, Ohio.

EXAMPLE 2

The same device as Example 1 except that the zinc oxide composition is replaced by a film of substantially pure zinc oxide having a thickness of about 2500 angstroms which is formed by vapor deposition of a film of zinc metal and oxidizing such film by heating in air.

Many other specific embodiments of the device of the present invention will be obvious to one skilled in the art in view of the foregoing disclosure. Thus, for example, the supporting glass plate and metal layers merely afford convenient means for supporting a very thin layer of the storing semiconductor composition and accurately selecting the length and cross-sectional area of current path therethrough. Thus, by decreasing the width of the gap between the metal layers or by increasing the thickness of the storing semiconductor composition coating, one can increase the current therethrough for a given set of conditions. Also, the electrical leads are a convenient means for passing current through the portion of the storing semiconductor body where current flow is controlled by the stored surface charge. Thus the metal layers and the electrical leads may be deposited on the charge accessible surface, if desired, since substantially only the portion of the surface actually contacted becomes part of the conducting path. The remaining portion of the charge accessible surface continues to store charge and is substantially electrically insulated from such conducting portion. In addition, other means may be used to pass current through the storing semiconductor body without requiring direct physical contact such as capacitive coupling or subjecting it to radiant energy whose wavelength is longer than that capable of neutralizing the stored charge. Any storing semiconductor material as defined above may be used in the present invention. As noted zinc oxide is the best known example of such material and its characteristics other than its field-effect properties have been described in detail in an article entitled "A Review of Electrofax" by James A. Amick in RCA Review, December 1959, vol. XX, No. 4, pages 753–769. However, in addition to zinc oxide, there are other materials such as lead oxide and cadmium oxide which exhibit similar characteristics. In the case of zinc oxide, besides substantially pure zinc oxide, a wide variety of zinc oxide compositions may be utilized which consist essentially of zinc oxide dispersed in a nonconductive binder. The zinc oxide to nonconducting resin ratio set forth in the aforementioned composition is approximately five to one, however, zinc oxide concentration may be increased so that the ratio is increased up to fifty to one or decreased so that the ratio is about three to one. Similarly, various dyes and sensitizers are added to the composition to increase the spectral response of the composition with the ones noted being typical.

Figure 3:
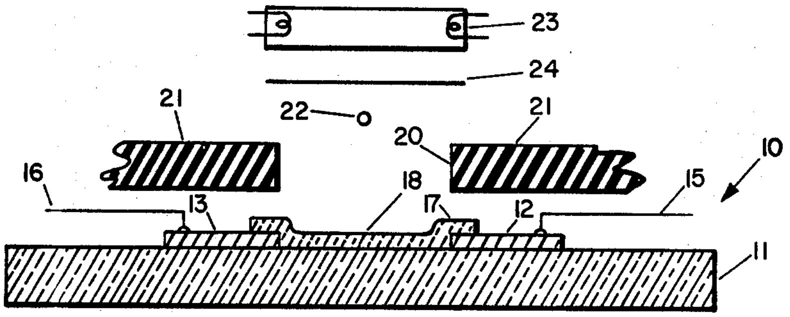
FIG. 3 is a schematic illustration of an apparatus employing the device of the present invention.

As illustrated in FIG. 3, the method of the present invention involves providing a device such as that set forth in FIGS. 1 and 2, then positioning the device 10 beneath a slot 20 in an insulating barrier 21 formed of material such as phenolic resin. A selected negative electrostatic charge formed by oxygen ions is then deposited on the surface 18 by setting up a potential difference in air between such surface and a wire 22 positioned immediately above the slot 20. Thus, in the specific test apparatus utilized, a slot area of about 5 mm. by 7 mm. is used with a one-half mil tungsten wire having a negative potential of 5 kilovolts to charge the surface with voltages in a range of 200 to 400 volts. Located above the slot 20 is a light source 23 separated from the slot 20 by a shutter 24 so that the device can be exposed to light for selected time periods. For example, in the test apparatus shown in FIG. 3, a four watt fluorescent light with its main intensity in the wavelength range is 3400 to 3800 angstroms was utilized to produce radiation intensity at the surface of the device of about 10 microwatts per square centimeter for time periods of about $\frac{1}{25}$ of a second.

After forming the aforementioned device and test equipment, the device was kept initially in total darkness for a period of at least 24 hours to establish a reference dark current, i.e., the current passing through the device in the absence of any exposure to light or any electrostatic charge on the surface of the device. Such dark current in the case of the devices as set forth in Example 1 usually was in the range of about $5\times10^{-9}$ to $5\times10^{-8}$ amps when connected across the 30 volt battery source. The device was then charged to maximum voltage by the corona-forming wire 22 so that current flow dropped to about $1\times10^{-9}$ amps, which was substantially the leakage current of the test apparatus. By then exposing the negatively charged surface of the device to a series of light pulses such as noted above, successive increases in current level were noted up to the level of the dark current. Above such level, the negative charge is substantially dissipated and the device operated in the usual photoconductive mode, i.e., current flow in excess of dark current is noted during the period of exposure to light and then decaying to the dark current level with the light source cut off. Depending on the formulation of the zinc oxide composition set forth in Example 1, i.e., the concentration of the zinc oxide in the binder resin, the negative electrostatic charge is maintained for substantial periods of time when the device was not exposed to light, i.e., the current control could be maintained over substantial time periods. Thus, it was found that by corona charging the current could be maintained at the initial low level for up to ten minutes after charging.

In the case of the device described in Example 2 above, it was found that the dark current of about $1 \times 10^{-4}$ amps was obtained when the device was connected across to one hundred volts (peak voltage) alternating current voltage source. When the device was then charged with a negative electrostatic charge, the current then dropped to $5 \times 10^{-8}$ amps.

Alternatively to the above described procedure, the method of the present invention may utilize the increase in conductivity of semiconductor material when subjected to radiant energy of suitable wavelength. In such alternate method, the device is initially exposed for a brief period of time to intense light. For example, the device may be subjected to the above noted fluorescent light for several seconds. Then the surface of the device is corona charged. Finally the surface electrostatic charge is selectively discharged to give the desired current flow. With such method, substantially higher currents may be passed through the device. However, since the conductivity increase decays with time, such higher currents are maintained for only a limited period of time.

Figure 4:
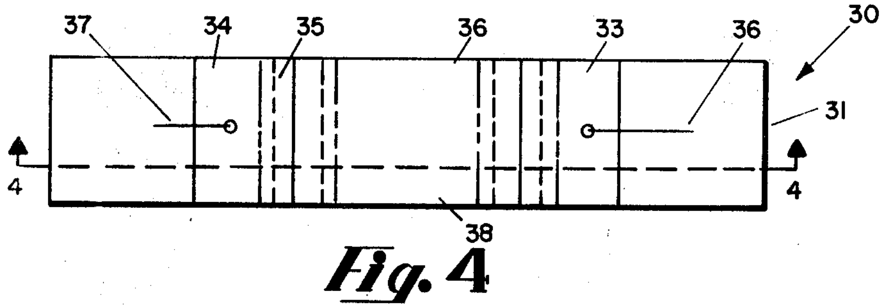
FIG. 4 is a plan view of another embodiment of the device of the present invention.
Figure 5:
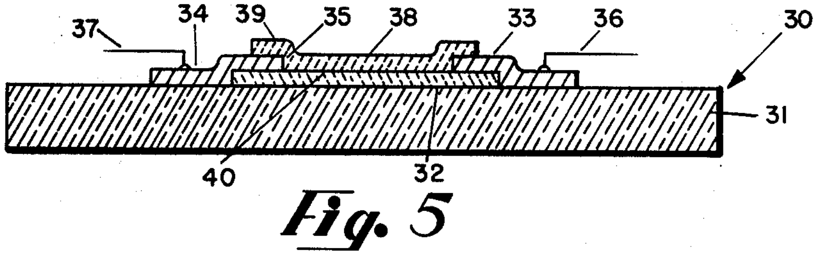
FIG. 5 is a cross-sectional view of FIG. 4 taken along line 4—4 of FIG. 4.

As set forth above, the device and method of the present invention employ a single body of a special type of semiconductor, i.e., a storing semiconductor material, to achieve the results of the present invention. However, more common semiconductor material such as cadmium sulfide may be utilized to achieve the results of the present invention if the charge storage is achieved by other means. Specifically, by utilizing a layer of insulating photoconductive material such as selenium in conjunction with a semiconductor material whose conductivity may be varied by the charge stored on the surface of the insulating photoconductive material, a similar device and method can be achieved. Specifically, as illustrated in FIGS. 4 and 5, a device 30 includes a glass supporting plate 31 having a layer 32 of semiconductor material deposited thereon. Deposited on the semiconductor layer 32 are adjacent layers of metal 33 and 34 separated by a gap 35. The metal layers 33 and 34 make electrical contact with the semiconductor layer 32. Electrically connected to the metal layers 33 and 34 are leads 36 and 37. On the top of the adjoining portions of the metal layers 33 and 34 and in the gap 35 is a layer 38 of insulating photoconductor material having a charge accessible first surface 39 and a second surface 40 adjacent to the layer 32 of semiconductor material.

The following specific example serves to illustrate the device shown in FIGS. 4 and 5; however, it should not be construed as limiting the invention which is properly set forth in the appended claims.

EXAMPLE 3

On the central portion of a glass slide 25 mm. wide and 75 mm. long and 1 mm. thick a layer of cadmium sulfide about 5 microns thick is vapor deposited. Then on the surface of the cadmium sulfide layer and the glass plate are vapor deposited adjacent layers of aluminum about 1000 angstroms thick separated by a gap of 1 mil. Finally vapor deposited upon the adjacent portions of the aluminum layers and in the gap is a layer of selenium about 7 microns thick.

Many other specific embodiments of the device illustrated in FIGS. 4 and 5 will be obvious to one skilled in the art in view of this disclosure, thus, as discussed above, any convenient insulating support means or means for passing current may be utilized. More important, any insulating photoconductor semiconductor may be used in the place of selenium which is adapted to store an electrostatic charge on its surface and to dissipate said charge in response to radiant energy impinging thereon. Similarly, other semiconductor materials may be used in place of cadmium sulfide which are adapted to control charge carriers in response to the charge deposited on the surface of the insulating photoconductor.

The method of the present invention utilizing the device as described in FIGS. 4 and 5 and is similar to the method set forth above in connection with FIG. 3. For example, with respect to the specific device described in Example 3, an initial current of about 3.7 microamps was found to be conducted therethrough by means of a 22.5 volt battery power source. A positive electrostatic charge was then deposited thereon by means of a corona discharge using a potential difference in the range of 5 to 7 kilovolts. The resulting surface potential was between 300 and 500 volts. Under such conditions, the current through the device increased to about 6.3 microamps. When the corona charging was stopped, the positive electrostatic charge then began to decay over a substantial period of time so that it took several minutes for the current to return to its initial value. However, when the surface was exposed to a green electroluminescent lamp for a period of about one second under a light influx of about $2 \times 10^{-6}$ watts per square centimeter, the current returned to its initial value in a small fraction of a second.

As set forth above, the present invention has been described with reference to the broad concept of a current control device wherein the current flow therethrough is controlled by an electrostatic charge on its surface and such charge in turn can be controlled by radiant energy impinging thereon. As used herein, the term "radiant energy" includes not only electromagnetic radiation but also electron beams. However, the present invention is particularly useful as a radiant energy integration device and method. Thus, the device and method is adapted to measure the total radiant energy input of such device and permit such measurement after exposure to the radiant energy has stopped. Such device is formed by depositing a selected electrostatic charge on the charge accessible surface of the device which may be ascertained by suitable calibration. Such selected electrostatic charge may be produced simply by depositing a positive or negative charge with an appropriate corona charging means. Also, it may be produced by depositing an excess charge and neutralizing such excess by an opposite corona charge. The method of such invention involves passing a reference current through the device with the selected charge on its surface. When the radiant energy to be measured is directed onto the charged surface then the change in current flow through the device is a measure of the total radiant energy input to the device.

There are many features in the present invention which clearly show the significant advance the present invention represents over the prior art. Consequently, only a few of the more outstanding features will be pointed out to illustrate the unexpected and unusual results obtained by the present invention. One feature of the present invention is that it permits control of current flow by the total radiant energy input to the device unlike the conventional photoconductive device which rely upon the instantaneous radiant energy intensity. More specifically, in the conventional photoconductive device, the conductivity thereof is increased above a given reference level by the generation of hole-electron pairs in the semiconductor material by the impinging radiation and such increase in conductivity is maintained by the continuous generation of such hole-electron pairs during exposure to such radiation. On the other hand, in the present invention, the conductivity of the device is either decreased or increased from an initial reference level to a given reference level by the deposition of an electrostatic charge on the surface of the device. For example, in the case of storing semiconductor body such as zinc oxide, a negative electrostatic charge on the surface of the body decreases the conductivity of the body from an initial "dark" level to a given lower level. Then, by impinging the radiant energy on the charged surface, the charge is dissipated in proportion to the total amount of radiant energy impinging thereon so that the conductivity is proportionally returned to the initial reference level. Another feature of the present invention, as can be seen from the foregoing discussion, is the integration of the impinging radiation so that the current change is a measure of the total radiant energy input rather than being a measure of the instantaneous radiant energy input as in the conventional photoconductive device.

Still another feature of the present invention is a current control device and method wherein the current flow therethrough is regulated by the electrostatic field formed by an electrostatic charge on the surface of the device and such charge in turn can be regulated by radiant energy impinging thereon. Thus the device and method of the present invention is similar to the field effect transistor in that the electrostatic field is utilized to regulate the current flow. However, in contrast to the field effect transistor, the electrostatic charge in the present invention is dissipated by radiant energy impinging thereon. In addition, the device and method of the present invention utilize a much simpler structure than the usual field effect transistor since it consists essentially of one or two layers of semiconductor material. Also, a small change in the electrostatic surface charge produces a much larger change in the total charge passed through the device during a selected time period under a selected set of conditions, i.e., a much larger change in the time-integrated current passing through the device.

Still another feature of the present invention is the utilization of a single layer of storing semiconductor material as a current control device wherein the electrostatic charge deposited thereon regulates the flow of current therethrough. Thus, in the past, storing semiconductor material such as zinc oxide has been used in electrophotographic coatings such as in the Electrofax process wherein the charge deposition and dissipation were utilized to selectively deposit material on the surface of said coating without regard to the internal effects of such charge in the zinc oxide coating. However, in the present invention, the electrostatic charge on the surface of the storing semiconductor material is used to regulate the current flow through said material and thus affords a novel current control device which can be regulated by radiant energy impinging thereon and, specifically, by the total radiant energy input. Similarly the present invention uses a layer of semiconductor material and a superimposed layer of insulating photoconductor material is used to regulate the current flow through said semiconductor material and such regulation in turn is controlled by the radiant energy impinging on the insulating photoconductor material.

It will be understood that the foregoing description and examples are only illustrative of the present invention and it is not intended that the invention be limited thereto. All substitutions, alterations, and modifications of the present invention which come within the scope of the following claims or to which the present invention is readily susceptible without departing from the spirit and scope of this disclosure are considered part of the present invention.

Having thus described the invention, what is claimed is:

1. Field-effect means comprising, in combination, a supporting substrate, a field-effect semiconductor layer having photoconductive properties on one surface of said substrate, a first electrode contacting one portion of said field-effect semiconductor layer, a second electrode spaced from said first electrode and contacting another portion of said field-effect semiconductor layer, said field-effect semiconductor having an exposed surface spased from said supporting substrate and said electrodes, said field-effect semiconductor surface being totally exposed to the ambient atmosphere in at least those areas to which current-controlling electrostatic charge is to be applied, and means for applying electrostatic charge to at least portions of said exposed surface, said field-effect semiconductor because of its photoconductive properties being capable of dissipating electrostatic charge present on the exposed surface thereof in response to actinic electromagnetic radiation impinging thereon.

2. The combination of claim 1 further including means connected to said electrodes for applying electrical potential thereto, the current flowing between said electrodes through said field-effect semiconductor being modulated by the polarity and magnitude of electrostatic charge on said exposed surface of said field-effect semiconductor layer.

3. The combination of claim 1 wherein said field-effect semiconductor is a storing field-effect semiconductor capable of retaining an electrostatic charge on said surface thereof and conducting current through the central portion thereof without substantially affecting said charge thereon.

4. The combination of claim 3 wherein said storing field-effect semiconductor is zinc oxide.

5. The combination of claim 1 wherein said means for applying an electrostatic charge to said exposed surface of said field-effect semiconductor applies negative electrostatic charges thereto.

6. The combination of claim 1 wherein said means for applying an electrostatic charge to said exposed surface of said field-effect semiconductor applies negative electrostatic charges in the form of oxygen ions thereto.

7. The combination of claim 1 wherein said portions of said field-effect semiconductor are in overlying contact with adjacent portions of said electrodes thereby forming a trough in said field-effect semiconductor between said electrodes for deposition of electrostatic charge thereto.

8. The combination of claim 1 wherein said field-effect semiconductor body is of a single conductivity type.

9. Field-effect means comprising, in combination, a supporting substrate, first and second electrodes supported by said substrate and separated by a gap therebetween, a body of field-effect semiconductor material having photoconductive properties disposed within said gap and contacting each of said electrodes, said field-effect semiconductor body having an exposed surface spaced from said supporting substrate and said electrodes, said exposed surface having no overlying layers thereon in at least those areas to which current-controlling electrostatic charge is to be applied, means for applying electrostatic charge to at least portions of said exposed surface of said field-effect semiconductor body, and means connected to said electrodes for applying electrical potential thereto, the current flowing between said electrodes through said field-effect semiconductor body being modulated by the polarity and magnitude of electrostatic charge on said exposed surface, said field-effect semiconductor because its photoconductive properties being capable of dissipating electrostatic charge present on the exposed surface thereof in response to actinic electromagnetic radiation impinging thereon.

10. Field-effect means comprising, in combination, a supporting substrate, a field-effect semiconductor layer of single conductivity type and having photoconductive properties on one surface of said substrate, a first electrode contacting one portion of said field-effect semiconductor layer, a second electrode spaced from said first electrode and contacting another portion of said field-effect semiconductor layer, said field-effect semiconductor having an exposed surface spaced from said supporting substrate and said electrodes, said field-effect semiconductor surface being totally exposed to the ambient atmosphere in at least those areas to which current-controlling electrostatic charge is to be applied, and means not in contact with said field-effect semiconductor layer for applying electrostatic charge to at least portions of said exposed surface, said field-effect semiconductor because of its photoconductive properties being capable of dissipating electrostatic charge present on the exposed surface thereof in response to actinic electromagnetic radiation impinging thereon.

11. Field-effect means comprising, in combination, a supporting substrate, a field-effect semiconductor layer on one surface of said supporting substrate, a first electrode contacting one portion of said field-effect semiconductor layer, a second electrode spaced from said first electrode and contacting another portion of said field-effect semiconductor layer, a layer of photoconductive insulating material overlying said field-effect semiconductor layer and in direct contact therewith, said photoconductive insulating material layer having an exposed surface spaced from said supporting substrate and said electrodes, said surface of said photoconductive insulating material layer being totally exposed to the ambient atmosphere in at least those areas to which current-controlling electrostatic charge is to be applied, and means for applying an electrostatic charge to at least portions of said exposed surface of said photoconductive insulating material layer.

12. The combination of claim 11 further including means connected to said electrodes for applying electrical potential thereto, the current flowing between said electrodes through said field-effect semiconductor being modulated by the polarity and magnitude of electrostatic charge on said exposed surface of said photoconductive insulating material layer.

13. The combination of claim 11 wherein said photoconductive insulating material comprises selenium.

14. The combination of claim 11 wherein said field-effect semiconductor comprises vitreous cadmium sulfide.

15. The combination of claim 11 wherein said means for applying electrostatic charge to said exposed surface of said photoconductive insulating material layer applies positive electrostatic charges thereto.

16. The combination of claim 11 wherein portions of said electrodes overlay said contacting portions of said field-effect semiconductor body, and portions of said photoconductive insulating material layer overlay adjacent portions of said electrodes whereby there is formed a trough in said photoconductive insulating material layer for deposition of electrostatic charge thereto.

17. The combination of claim 11 further including means to expose said photoconductive insulating material layer to actinic electromagnetic radiation.

18. The combination of claim 11 wherein said field-effect semiconductor body is of a single conductivity type.

19. Field-effect means comprising, in combination, a supporting substrate, first and second electrodes supported by said substrate and separated by a gap therebetween, a body of field-effect semiconductor material disposed within said gap and contacting each of said electrodes, a layer of photoconductive insulating material overlying said field-effect semiconductor body and in direct contact therewith, said photoconductive insulating material layer having an exposed surface spaced from said supporting substrate and said electrodes, said exposed surface having no overlying layers thereon in at least those areas to which current-controlling electrostatic charge is to be applied, means for applying electrostatic charge to at least portions of said exposed surface of said photoconductive insulating material layer, and means connected to said electrodes for applying electrical potential thereto, the current flowing between said electrodes through said field-effect semiconductor layer being modulated by the polarity and magnitude of electrostatic charge on said exposed surface.

20. Field-effect means comprising, in combination, a supporting substrate, a field-effect semiconductor layer of single conductivity type on one surface of said supporting substrate, a first electrode contacting one portion of said field-effect semiconductor layer, a second electrode spaced from said first electrode and contacting another portion of said field-effect semiconductor layer, a layer of photoconductive insulating material overlying said field-effect semiconductor layer and in direct contact therewith, said photoconductive insulating material having an exposed surface spaced from said supporting substrate and said electrodes, said photoconductive insulating material surface being totally exposed to the ambient atmosphere in at least those areas to which current-controlling electrostatic charge is to be applied, and means not in contact with said photoconductive insulating material layer for applying electrostatic charge to at least portions of said exposed surface.

21. A method of regulating current flow comprising: providing field-effect means comprising a support substrate, a storing field-effect semiconductor layer having photoconductive properties of single conductivity type on one surface of said substrate, a first electrode contacting one portion of said storing field-effect semiconductor layer, a second electrode spaced from said first electrode and contacting another portion of said storing field-effect semiconductor layer, said storing field-effect semiconductor layer having an exposed surface spaced from said supporting substrate and said electrodes, said field-effect semiconductor surface being totally exposed to the ambient atmosphere in at least those areas to which current-controlling electrostatic charge is to be applied; applying potential to said electrodes; applying electrostatic charge to said exposed surface of said storing field-effect semiconductor layer whereby the flow of current between said electrodes through said storing field-effect semiconductor layer is modulated by the polarity and magnitude of said electrostatic charge on said exposed surface; and impinging upon said charged surface electromagnetic radiation to which said storing field-effect semiconductor material is actinic.

22. A method of measuring total radiant energy input to a surface comprising: providing a field-effect means comprising a supporting substrate, a storing field-effect semiconductor layer of single conductivity type on one surface of said substrate, a first electrode contacting one portion of said storing field-effect semiconductor layer, a second electrode spaced from said first electrode and contacting another portion of said storing field-effect semiconductor layer, said storing field-effect semiconductor layer having an exposed surface spaced from said supporting substrate and said electrodes, said field-effect semiconductor surface being totally exposed to the ambient atmosphere in at least those areas to which current-controlling electrostatic charge is to be applied, said storing field-effect semiconductor material also having photoconductive properties; applying potential to said electrodes, applying electrostatic charge to said exposed surface of said storing field-effect semiconductor layer; impinging upon said charged surface electromagnetic radiation to which said storing field-effect semiconductor material is actinic; and measuring the change in current flow between said electrodes through said storing field-effect semiconductor layer in response to said imaging electromagnetic radiation.

23. A method of regulating current flow comprising: providing field-effect means comprising a supporting substrate, a field-effect semiconductor layer of single conductivity type on one surface of said supporting substrate, a first electrode contacting one portion of said field-effect semiconductor layer, a second electrode spaced from said first electrode and contacting another portion of said field-effect semiconductor layer, a layer of photoconductive insulating material overlying said field-effect semiconductor layer and in direct contact therewith, said photoconductive insulating material layer having an exposed surface spaced from said supporting substrate and said electrodes, said surface of said photoconductive insulating material layer being totally exposed to the ambient atmosphere in at least those areas to which current-controlling electrostatic charge is to be applied; applying potential to said electrodes; applying electrostatic charge to said exposed surface of said photoconductive insulating material layer whereby the flow of current between said electrodes through said field-effect semiconductor layer is modulated by the polarity and magnitude of said electrostatic charge on said exposed surface; and impinging upon said charged surface electromagnetic radiation to which said photoconductor insulating material is actinic.

24. A method of measuring the total radiant energy input to a surface comprising: providing field-effect means comprising a supporting substrate, a field-effect semiconductor layer of single conductivity type on one surface of said supporting substrate, a first electrode contacting one portion of said field-effect semiconductor layer, a second electrode spaced from said first electrode and contacting another portion of said field-effect semiconductor layer, a layer of photoconductive insulating material overlying said field-effect semiconductor layer and in direct contact therewith, said photoconductive insulating material layer having an exposed surface spaced from said supporting substrate and said electrodes, said surface of said photoconductive insulating material layer being totally exposed to the ambient atmosphere in at least those areas to which current-controlling electrostatic charge is to be applied; applying potential to said electrodes; applying electrostatic charge to said exposed surface of said photoconductive insulating material layer; impinging upon said charged surface electromagnetic radiation to which said photoconductive insulating material is actinic; and measuring the change in current flow between said electrodes through said field-effect semiconductor layer in response to said impinging electromagnetic radiation.

25. The combination of claim 1 wherein said exposed surface is substantially parallel to said supporting substrate.

26. The combination of claim 11 wherein said exposed surface is substantially parallel to said supporting substrate.

27. The combination of claim 1 further including means to expose said exposed surface of said field-effect semiconductor layer having electrostatic charge thereon to actinic electromagnetic radiation to dissipate at least a portion of said charge.

28. The combination of claim 19 further including means to expose said photoconductive insulating material layer to actinic electromagnetic radiation.

References Cited

UNITED STATES PATENTS

| | | | |
|---|---|---|---|
| 806,052 | 11/1905 | Blackmore | 250—211 X |
| 2,692,948 | 10/1954 | Lion | 250—213 X |
| 3,348,074 | 10/1967 | Diemer | 317—235 X |
| 2,791,758 | 5/1957 | Looney. | |
| 2,791,761 | 5/1957 | Morton. | |
| 2,805,347 | 9/1957 | Haynes. | |
| 2,818,511 | 12/1957 | Ullery | 250—211 |
| 2,879,405 | 3/1959 | Pankove | 250—211 |
| 3,097,308 | 7/1963 | Wallmark. | |
| 3,265,899 | 8/1966 | Bergstrom et al. | |
| 3,304,469 | 2/1967 | Weimer. | |
| 3,369,159 | 2/1968 | Sihvonen. | |
| 3,372,317 | 3/1968 | Yamashita. | |
| 3,373,059 | 3/1968 | Augustine. | |

WALTER STOLWEIN, Primary Examiner

U.S. Cl. X.R.

317—235